(12) United States Patent
Tsai et al.

(10) Patent No.: US 10,158,364 B1
(45) Date of Patent: Dec. 18, 2018

(54) REALIGNMENT STRENGTH CONTROLLER FOR SOLVING LOOP CONFLICT OF REALIGNMENT PHASE LOCK LOOP

(71) Applicant: Taiwan Semiconductor Manufacturing Co., Ltd., Hsin-Chu (TW)

(72) Inventors: Tsung-Hsien Tsai, Zhongli (TW); Cheng-Hsiang Hsieh, Hsin-Chu (TW); Chih-Hsien Chang, New Taipei (TW); Ruey-Bin Sheen, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/882,544

(22) Filed: Jan. 29, 2018

Related U.S. Application Data

(60) Provisional application No. 62/552,956, filed on Aug. 31, 2017.

(51) Int. Cl.
*H03L 7/087* (2006.01)
*H03L 7/099* (2006.01)
*H03L 7/089* (2006.01)
*H03B 5/24* (2006.01)
*H03K 3/03* (2006.01)

(52) U.S. Cl.
CPC ............ *H03L 7/087* (2013.01); *H03B 5/24* (2013.01); *H03K 3/0315* (2013.01); *H03L 7/0891* (2013.01); *H03L 7/0995* (2013.01)

(58) Field of Classification Search
CPC ... H03L 7/0891; H03L 7/0868; H03L 7/0992; H03L 7/0993; H03L 7/0994; H03L 7/0995; H03L 7/102; H03L 7/107; H03L 7/1075
See application file for complete search history.

(56) References Cited

U.S. PATENT DOCUMENTS

| | | | | |
|---|---|---|---|---|
| 5,349,309 A | * | 9/1994 | Fujii | H03L 7/0991 331/1 A |
| 5,832,048 A | * | 11/1998 | Woodman, Jr. | H03L 7/08 375/376 |
| 6,710,665 B2 | * | 3/2004 | Maneatis | G05F 3/262 331/16 |
| 6,897,690 B2 | * | 5/2005 | Keaveney | H03K 3/0231 327/148 |
| 8,810,291 B2 | * | 8/2014 | Chen | H03L 7/08 327/156 |

* cited by examiner

*Primary Examiner* — An T Luu
(74) *Attorney, Agent, or Firm* — Duane Morris LLP

(57) ABSTRACT

A circuit having a tracking loop and a realignment loop is disclosed. The circuit includes: a phase frequency detector (PFD) module for comparing a phase difference of a first input signal and a second input signal; a pump module for converting PFD phase error to charge, wherein the pump module further comprises a low pass filter (LPF); an adjustable realignment module for adjusting a realignment strength, the adjustable realignment module receives a first plurality of inputs from the PFD module, the adjustable realignment module transmits a second plurality of outputs to the pump module; and a ring oscillator unit, the ring oscillator unit receives a first input from the pump module and a second input from the adjustable realignment module, and based on the first and second inputs produces a feedback signal.

20 Claims, 11 Drawing Sheets

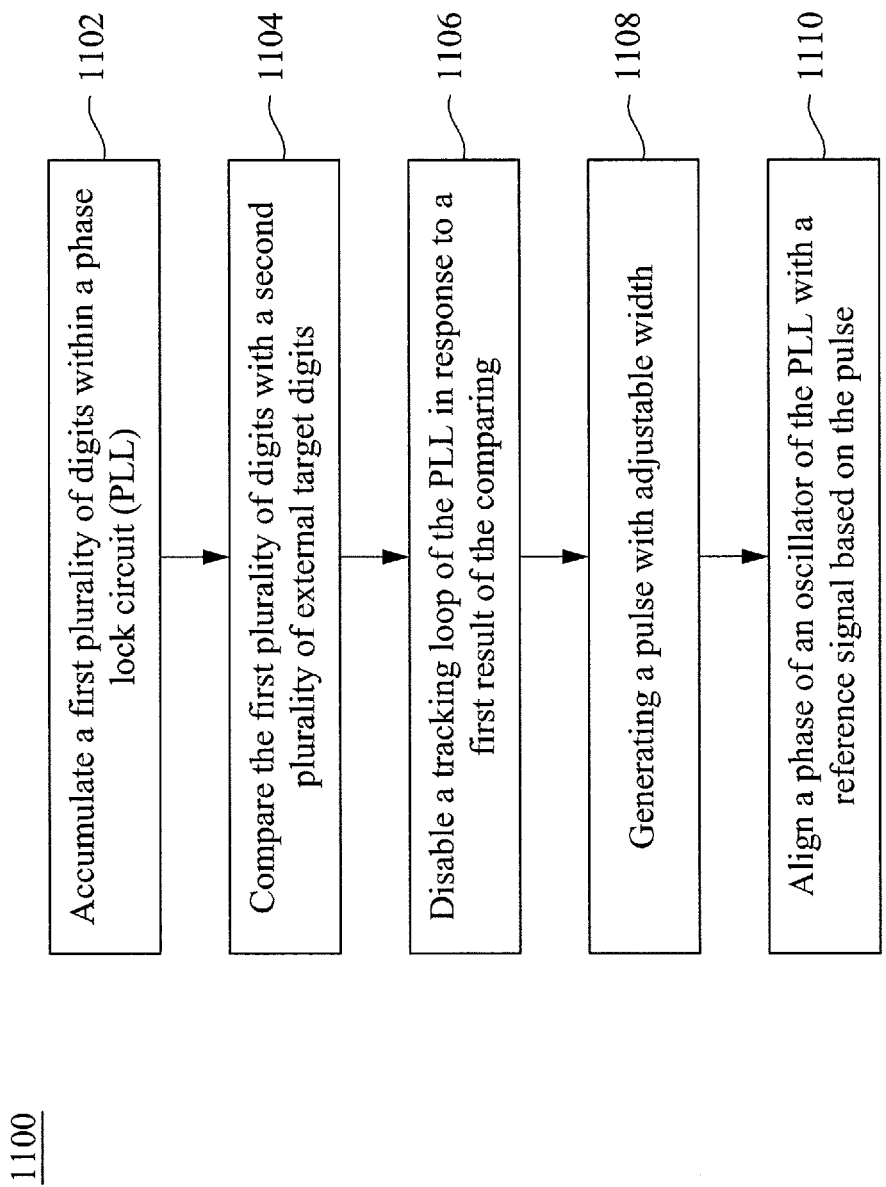

US 10,158,364 B1

REALIGNMENT STRENGTH CONTROLLER FOR SOLVING LOOP CONFLICT OF REALIGNMENT PHASE LOCK LOOP

CROSS-REFERENCE TO RELATED APPLICATION

The present application claims priority to U.S. Provisional Patent Application No. 62/552,956, filed on Aug. 31, 2017, which is incorporated by reference herein in its entirety.

BACKGROUND

A phase frequency detector (PFD) is a device which compares the phase of two input signals. The PFD includes two inputs which correspond to two different input signals, usually one from a voltage-controlled oscillator (VCO) and another from other external sources. The PFD has two outputs which instruct subsequent circuitry how to adjust the frequency to lock onto the phase of the reference signal. To form a phase-locked loop (PLL), a PFD phase error output is transmitted to a loop filter which integrates the signal to smooth it. The smoothed signal is transmitted to a VCO which generates an output signal with a frequency that is proportional to the input voltage. The VCO output is also transmitted back to the PFD to lock into phase with the reference signal.

A pump converts the PFD digital phase error to an analog charge. The PFD and pump of a traditional tracking loop (i.e., signal path) is disabled when the PLL operates in a realignment mode. As a result, the PLL is not capable of recovering the target frequency in realignment mode when the PLL suffers from temperature variation. In order to recover the target frequency, the traditional tracking loop is enabled. In the tracking loop, the PFD and pump convert the phase difference of a reference and feedback clock to a voltage for finely adjusting frequency of the oscillator. In the realignment loop, the reference clock directly aligns the phase of the oscillator. When two loops are enabled together, two instructions are injected into a ring oscillator of the PLL at the same time to create a loop conflict, which refers to a situation when there is a traditional tracking loop and a realignment loop in the circuit. The worst case scenario conflict occurs at the realignment strength of 1:1, which creates spurs at high frequency. As discussed in further detail below, "realignment strength", also known as loop weight, reflects the relative strength between the traditional tracking loop and the realignment loop. A "spur" is a peak in the log-log plot of the power spectral density figure. In order to reduce conflict and improve integrated jitter, the realignment strength can be adjusted.

In conventional approaches, the conflict of a traditional loop and a realignment loop is controlled by adjusting the strength of realignment. A weak realignment reduces the conflict between two loops, however, the corresponding rise in integrated jitter poses problems. A strong realignment suppresses the in-band noise of PLL, but the out-band spur is generated by strong conflict to degrade integrated jitter.

The realignment improves integrated jitter of the PLL by aligning the phase of the ring oscillator with the reference clock. When the PLL operates in the realignment mode, the PFD and pump of a traditional tracking loop is disabled to avoid a loop conflict. In this scenario, the PLL frequency can't be recovered in realignment mode when the PLL suffers temperature variation when the tracking loop is disabled. As a result, the traditional tracking loop must be enabled to trace a target frequency when the PLL suffers temperature variation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is a flow chart illustrating a method for adjusting a realignment strength of a phase lock circuit, in accordance with some embodiments.

DETAILED DESCRIPTION OF EXEMPLARY EMBODIMENTS

Figure 1:
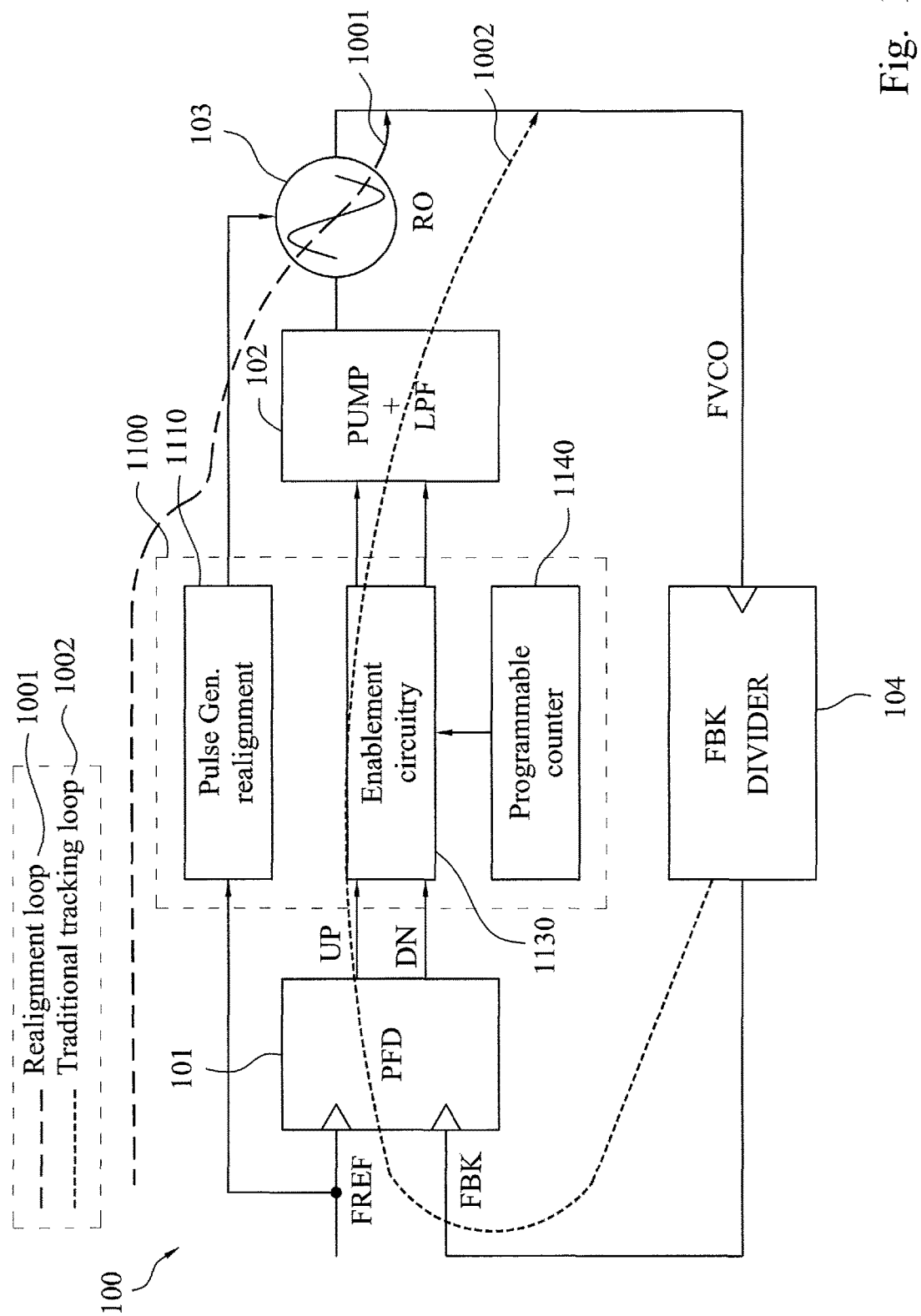
FIG. 1 is a schematic illustration of a circuit for solving loop conflict of realignment PLL, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A circuit for solving loop conflicts of a realignment PLL may include a phase frequency detector (PFD) module, which receives two signals as input, a reference frequency FREF and a feedback frequency FBK. The PDF module transmits two outputs signals, UP and DN, to a pump module that includes a low pass filter (LPF). The output of the pump module is transmitted to a ring oscillator, which also receives the reference frequency signal FREF. The output of the ring oscillator is transmitted to a feedback divider, which transmits the divided feedback signal FBK back to the PFD module as one of the two inputs. There is a first loop called a realignment loop and a second loop called a traditional tracking. The suppression of PLL in-band noise for the integrated jitter improvement is at least partly performed by the realignment loop. The main function of the tracking loop in realignment mode is to recover the target frequency when the PLL suffers from temperature variation. When the PLL operates in realignment mode, the PFD module and pump module of the traditional tracking loop must be disabled to avoid loop conflict. The traditional tracking loop in realignment mode also adjusts the phase of the ring oscillator. Two instructions corresponding to the traditional tracking loop and the realignment loop, respectively, are injected into the ring oscillator at the same time to create a loop conflict (spur at out-band). In-band signaling is the sending of control information within the same band or channel used for signal. Out-of-band, or out-band, signaling is the sending of control information over a different channel. Spur at out-band means the existence of a spur, or a peak, in a channel different from the signal channel. The worst case scenario conflict occurs when the realignment strength is 1:1 in realignment mode. The realignment strength is adjusted to reduce conflict. The effect of realignment strength on the power spectral density is discussed here based on a realignment weight of 1:1, in which, the first number designates the tracking loop and the second number designates the realignment loop. There is a peak, or a spur at the high frequency end for a realignment weight of 1:1. As a comparison, there is no peak or spur at the high frequency end for a realignment weight of 1:N, in which similarly, the first number designates the tracking loop and the second number designates the realignment loop. When the value of N is adjusted to a large value, the spur at the high frequency end is eliminated.

The reference and feedback clock edges of the PLL is brought into close alignment. The average difference in time between the phases of the two signals when the PLL has achieved lock is called the static phase offset, also known as the steady-state phase error. The variance between these phases is called tracking jitter. In an ideal mode, the static phase offset is zero and the tracking jitter should be as low as possible. Phase noise is another type of jitter observed in PLLs, which is caused by the oscillator itself and by elements implemented in the oscillator's frequency control circuit. Realignment improves integrated jitter of the PLL by aligning the phase of the ring oscillator with a reference clock. When PLL operates in the realignment mode, the PFD module and pump module of traditional tracking loop are disabled to avoid a loop conflict. In one example, when the tracking loop is disabled, the PLL suffers from temperature variation when the frequency is 3 GHz and the frequency can drop to 2.7 GHz. As a result, the PLL frequency cannot be recovered in the realignment mode.

In order to recover the frequency, the traditional tracking loop must be enabled. When the PLL suffers temperature variation, the traditional tracking loop is enabled to trace a target frequency. When the traditional tracking loop is enabled, the frequency returns back to 3 GHz value starting. The conflict of the traditional tracking loop and the realignment loop is controlled by adjusting the strength of realignment. The strength of realignment is indicated by a pulse width of the realignment, which is determined by the duration that the realignment loop is enabled by selector signal en_realign. A weak realignment strength reduces the conflict between two loops. But as a result, the increase in integrated jitter affects the overall performance. The realignment strength reflects the ratio between the amount of time (e.g., number of cycles) when the realignment loop is enabled in the circuit, and the amount of time when the realignment loop is disabled in the circuit. A strong realignment suppresses the in-band noise of the PLL, but the side effect is that an out-band spur is generated by a strong conflict between the two loops. As a result, the overall performance is degraded due to integrated jitter. In one example, when the pulse width of the realignment is wide, meaning the realignment strength is strong, a spur or a peak shows at the high frequency end of the PSD. When the pulse width of the realignment is narrow, meaning the realignment strength is weak, no spur is shown on the PSD. The energy consumption is proportional to the area under a PSD curve. Accordingly, the elimination of the spur on the PSD reduces energy consumption.

FIG. 1 is a schematic illustration of a circuit for solving loop conflict of realignment PLL, in accordance with some embodiments. According to some embodiments, an adjustable realignment module 1100 is implemented to adjust the realignment strength. The module 101 is a PFD module with FREF and FBK as inputs, module 102 is a pump module with a LPF, device 103 is a ring oscillator, and device 104 is a feedback divider. According to some embodiments, the adjustable realignment module 1100 further includes a realignment pulse generator unit 1110 for generating pulses with adjustable width. According to some embodiments, the adjustable realignment module 1100 further includes an enablement circuit unit 1130 for breaking a tracking loop 1002. According to some embodiments, the adjustable realignment module 1100 further includes programmable counter unit 1140.

According to some embodiments, the adjustable realignment module 1100 includes an enablement circuit unit 1130 to enable the traditional loop 1002, a programmable counter unit 1140 for the enablement circuit unit 1130 and a realignment pulse generator unit 1110 for realignment. The enablement circuit unit 1130 of the traditional loop 1002 is inserted between the PFD module 101 and the pump module 102. According to some embodiments, when the enablement circuit unit 1130 is turned on, the output signal (DN) of the PFD module 101 can be transmitted to the pump module 102 which enables the traditional tracking loop 1002. According to some embodiments, when the enablement circuit unit 1130 is turned off, the output signal (DN) is cut off and the traditional tracking loop 1002 is blocked. According to some embodiments, the enablement circuit unit 1130 is controlled by the programmable counter unit 1140. According to some embodiments, the high level output of the programmable counter unit 1140 turns off the enablement circuit unit 1130 and the low level output turns on the enablement circuit unit 1130. According to some embodiments, the realignment pulse generator unit 1110 for the realignment oscillator 103 is programmable for adjusting the realignment strength.

Figure 2:
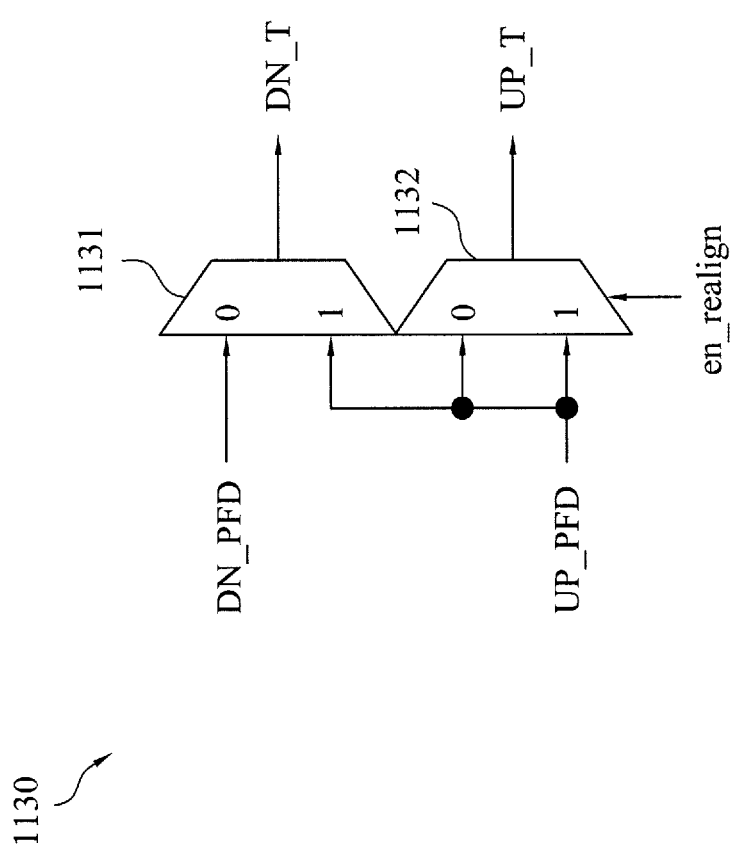
FIG. 2 is a schematic illustration of an enablement circuitry, in accordance with some embodiments.

FIG. 2 is a schematic illustration of an enablement circuitry, in accordance with some embodiments. According to some embodiments, in the traditional tracking loop 1002, the PFD module 101 converts the frequency and phase difference between reference clock FREF and oscillator FBK to the output pulses of UP and DN. According to some embodiments, the PUMP module 102 converts the pulse width difference between UP and DN to a current difference. According to some embodiments, the DN signal from the PFD module 101 is DN_PFD which is transmitted to the multiplexer 1131 as an input. According to some embodiments, the UP signal from the PFD module 101 is UP_PFD which is transmitted to both inputs of multiplexer 1132 and the other input of multiplexer 1131. In order to efficiently disable the traditional tracking loop 1002 for realignment purposes, the enablement circuit unit 1130 is implemented between the PFD module 101 and the pump module 102. According to some embodiments, the enablement circuit unit 1130 disables the tracking loop 1002 by setting the selector signal en_realign to a disabling value in realignment mode. According to some embodiments, the enablement circuit unit 1130 maintains an unimpeded DN path in normal operation.

According to some embodiments, the enablement circuit unit 1130 includes a first multiplexer 1131 and a second multiplexer 1132. The second multiplexer 1132 of the enablement circuit unit 1130 is controlled by a control signal of en_realign. According to some embodiments, when the signal en_realign is at level high, it breaks the DN signal in the tracking loop 1002. As discussed above, according to some embodiments, the selector signal en_realign is implemented to disable or enable the PFD and pump modules, and as a result, to disable or enable the tracking loop 1002. Conversely, the DN signal can be transmitted to the PUMP module 102 when the signal is at a level low. According to some embodiments, the first multiplexer 1131 and the second multiplexer 1132 are clock multiplexers.

Figure 3:
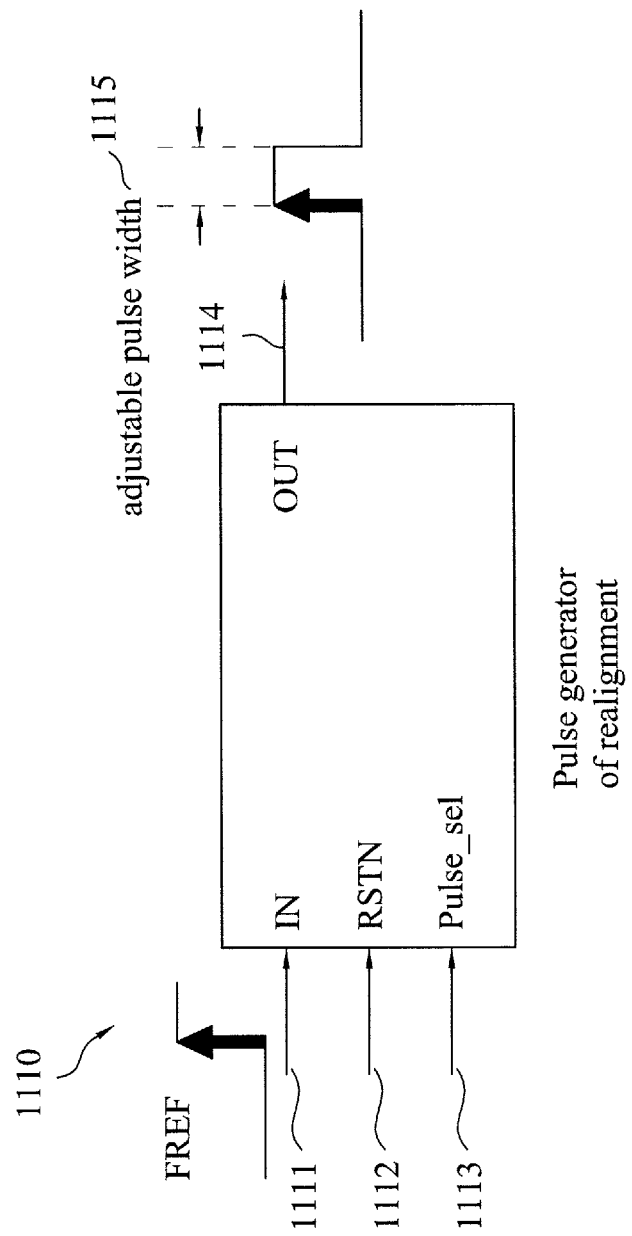
FIG. 3 is a schematic illustration of a pulse generator of realignment, in accordance with some embodiments.

FIG. 3 is a block diagram of a pulse generator of realignment, in accordance with some embodiments. According to some embodiments, the pulse generator of realignment unit 1110 includes inputs IN 1111, RSTN 1112, Pulse_sel 1113, and output OUT 1114. Each of these signals is discussed in further detail below with reference to FIG. 4. According to some embodiments, the pulse generator of realignment unit 1110 also receives the input FREF of the PFD module 101 which is driven by a reference clock, as discussed above with respect to FIG. 1. The pulse generator of realignment unit 101 receives the rising edge of the reference clock and immediately transmits the rising edge to the ring oscillator 103. According to some embodiments, the pulse generator of realignment unit 1110 also generates a pulse having an adjustable pulse width 1115 for adjusting the strength of realignment. According to some embodiments, the ring oscillator 103 starts to align its phase with the reference signal FREF when it receives the pulse provided by the pulse generator of realignment unit 1110. The realigned strength of ring oscillator 103 is decided by the realigned pulse width 1115. According to some embodiments, a wide pulse width provides strong strength to align the phase of ring oscillator 103. According to some embodiments, the pulse generator of realignment unit 1110 includes programmable bits for adjustable pulse width.

Figure 4:
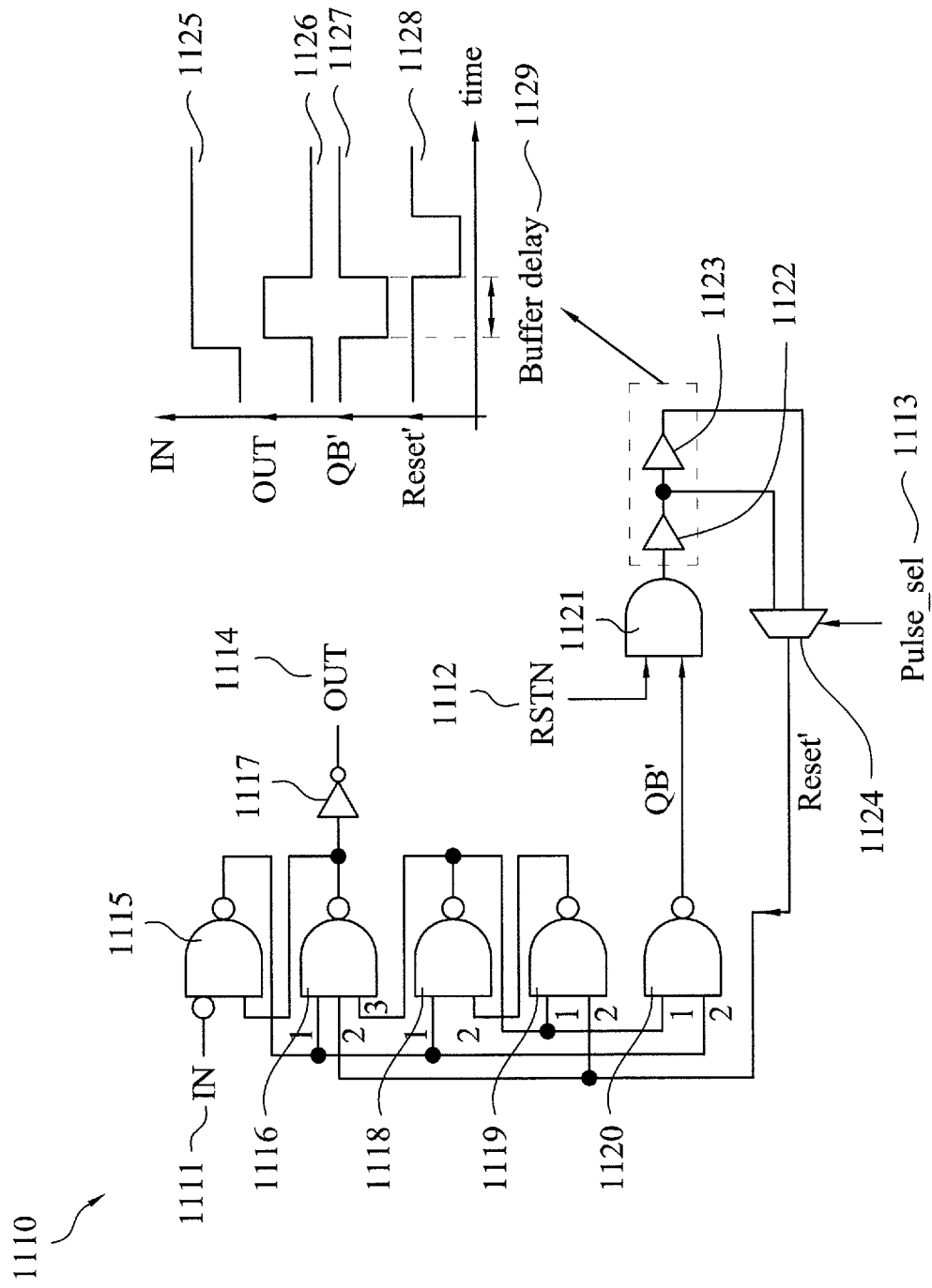
FIG. 4 is a schematic illustration of an exemplary pulse generator of realignment and its corresponding timing diagram, in accordance with some embodiments.

FIG. 4 is a schematic illustration of a pulse generator of realignment 1110 and its corresponding timing diagram, in accordance with some embodiments. According to some embodiments, the pulse generator of realignment unit 1110 includes five NAND gates 1115, 1116, 1118, 1119, 1120, an AND gate 1121, a multiplexer 1124, a NOT gate 1117 and two amplifiers 1122 and 1123, which are electrically connected with each other as illustrated in FIG. 4. The IN 1111 is an input to the NAND gate 1115, the RSTN 1112 is an input to the AND gate 1112, the Pulse_sel 1113 is a selector signal of the multiplexer 1124, the OUT 1114 is the output of the inverter 1117. The amplifiers 1122 and 1123 form a buffer which causes a buffer delay 1129 when the IN signal is 1125. When the IN signal is 1125, the OUT is signal 1126, as a result, the QB' signal is 1127, and the Reset' signal is 1128 causing a buffer delay 1129, as illustrated in FIG. 4. According to some embodiments, the magnitude of the buffer delay 1129 is determined by the pulse width 501 discussed above. As discussed above, a wide pulse width 501 provides strong realignment strength.

Figure 5:
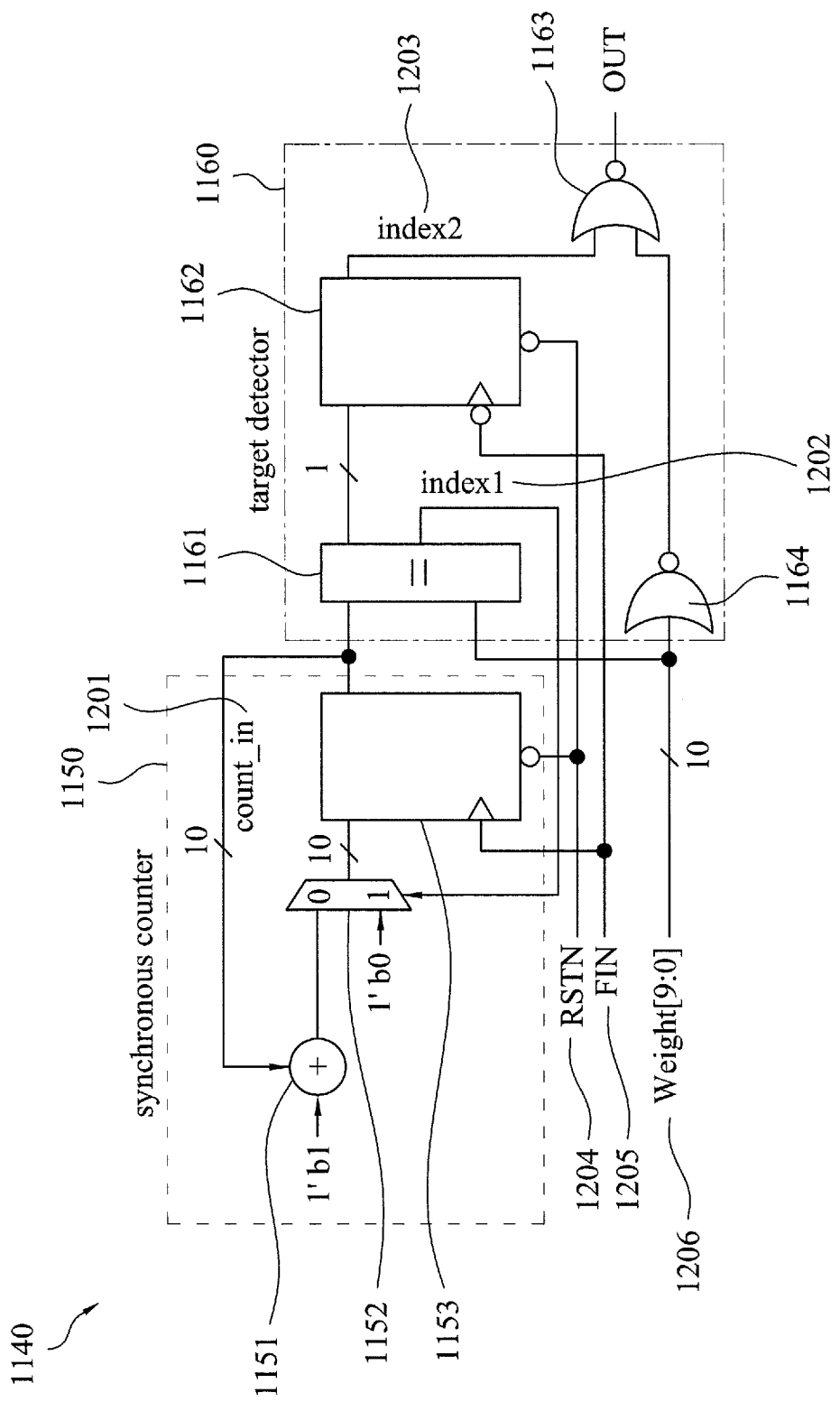
FIG. 5 is a schematic illustration of a programmable counter, in accordance with some embodiments.

FIG. 5 is a schematic illustration of a programmable counter 1140, in accordance with some embodiments. According to some embodiments, the programmable counter unit 1140 includes a synchronous counter 1150 and a target detector 1160. According to some embodiments, the synchronous counter 1150 includes a latch 1153, a multiplexer 1152 and an adder 1151, which are electrically connected to each other as illustrated in FIG. 5. According to some embodiments, the target detector 1160 includes a latch 1162, NOR gates 1163 and 1164 and an equator 1161. The synchronous counter 1150 is driven by reference clock FIN 1205 to accumulate digits. The synchronous counter 1150 receives the signal of the target detector 1160 to erase internal digits. The target detector 1160 compares the digits of synchronous counter 1150 and external target digits' weight [9:0] signal 1206. The target detector 1160 generates a level-low ("0") when the internal digits match the external target, and generates a level-high ("1") otherwise. The target detector 1160 also detects the input digits of 1206 weight [9:0]. The output of the target detector 1160 is forced to "0" to ignore the internal circuitry operation if the digit of weight is "0". As discussed in further detail below with reference to FIG. 6, the programmable counter 1140 controls the enablement circuit unit 1130 to determine whether the tracking loop 1002 is enabled or not, in accordance with some embodiments.

Figure 6:
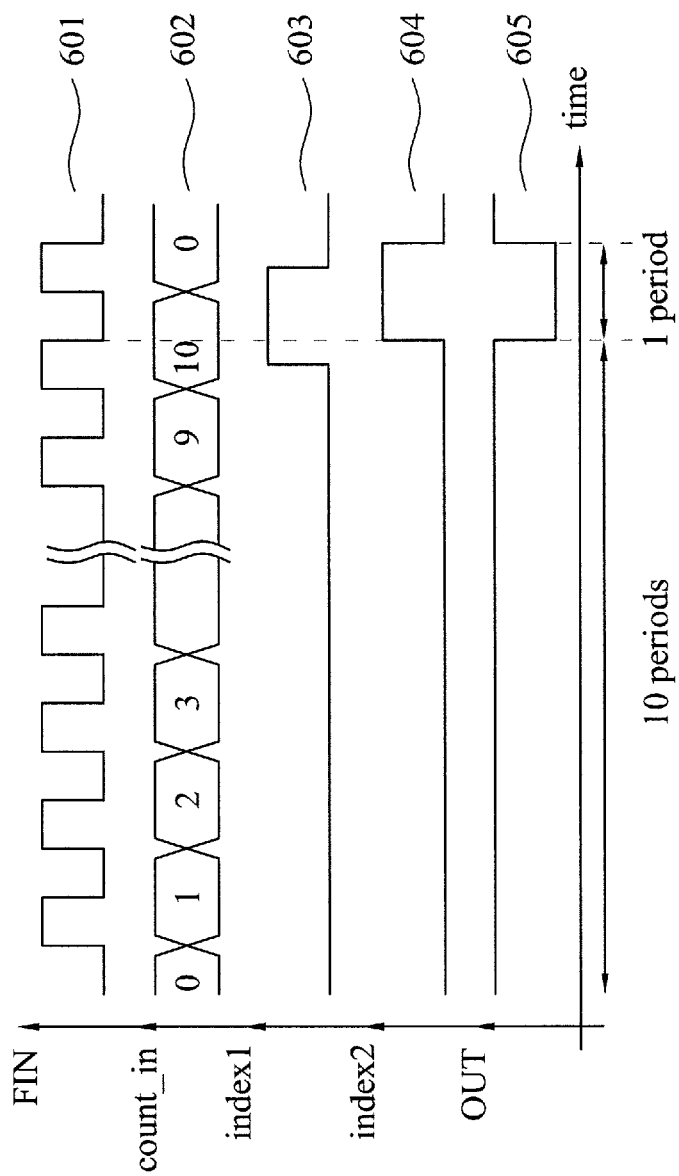
FIG. 6 is a schematic illustration of the timing diagram of the programmable counter in FIG. 5, in accordance with some embodiments.

FIG. 6 is a schematic illustration of the timing diagram of the programmable counter of FIG. 5, in accordance with some embodiments. According to some embodiments, when the reference clock FIN 1205 has the timing diagram 601, the count_in signal 1201 has the timing diagram 602, and the corresponding index1 1202 and index2 1203 signals have timing diagrams 603 and 604, respectively. As a result, the OUT signal on the output of the NOR gate 1163 has a diagram 1205. There are 10 periods before the dropping edge of the timing diagram 605, and the OUT stays at low for one period. According to some embodiments, the ratio of the 10 periods and 1 period, 10:1, is the realignment strength ratio between the realignment loop 1001 and the traditional tracking loop 1002. According to some embodiments, as a comparison, when the pulse width 501 is properly adjusted to achieve a realignment strength of 1023:1, the timing diagram of OUT signal shows 1023 periods of high followed by 1 period of low.

Figure 7:
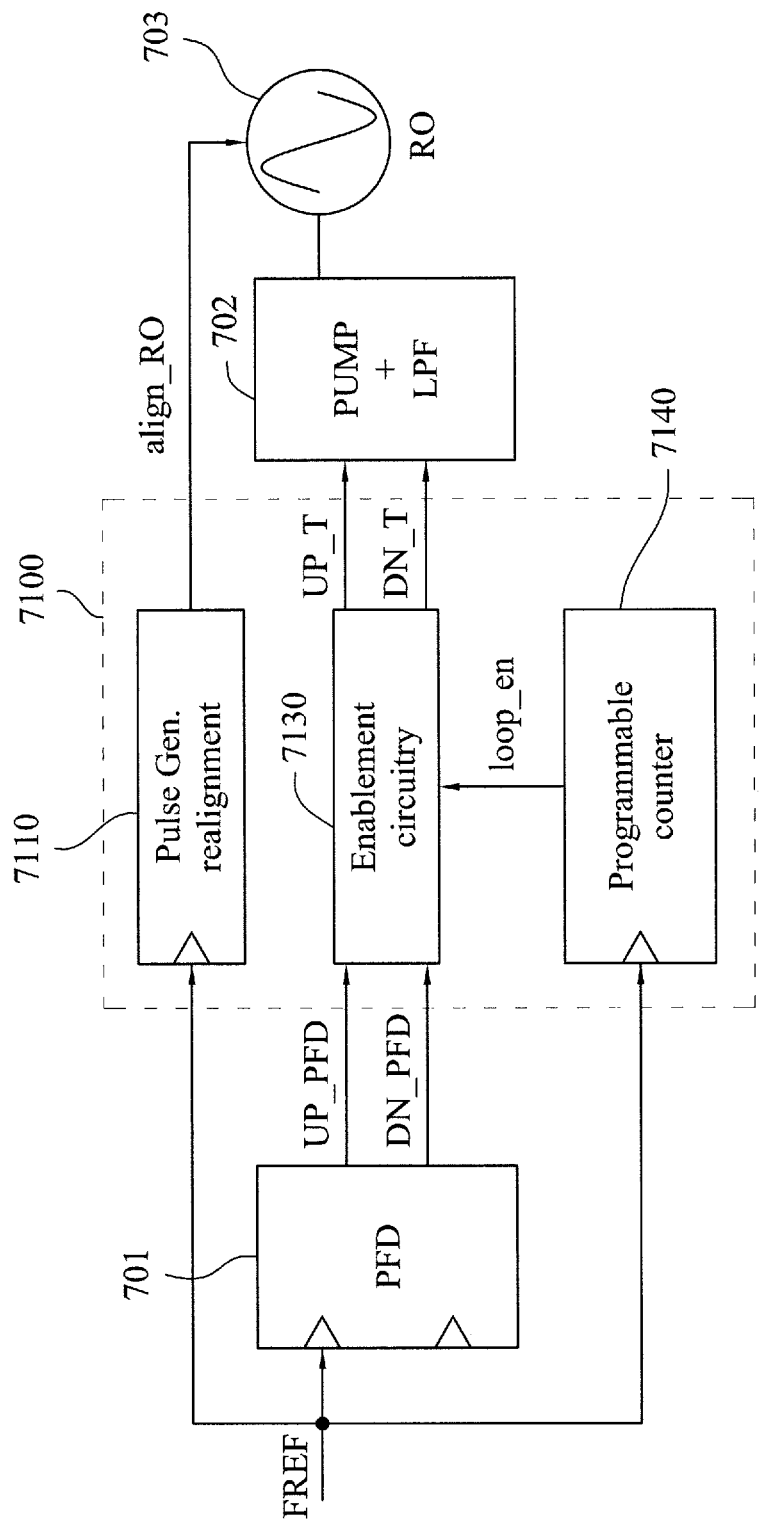
FIG. 7 is a schematic illustration of an exemplary circuit for solving loop conflict of realignment PLL, in accordance with some embodiments.

FIG. 7 is a schematic illustration of an exemplary circuit for solving loop conflict of realignment PLL, in accordance with some embodiments. According to some other embodiments, the realignment module 7100 includes a pulse generator unit 7110, an enablement circuit unit 7130 and a programmable counter unit 7140. The realignment module 7100 is electrically connected to the PFD module 701, the pump module 702 and the ring oscillator 703 as illustrated in FIG. 7.

According to some embodiments, the pulse generator unit 7110 is driven by reference clock FIN and it sends the aligned phase to the ring oscillator 703 every reference cycle. The enablement circuit of realignment unit 7130 can be disconnected and then connected to the tracking loop 1002 by adopting a programmable counter 7140. According to some embodiments, the combination of the pulse generator unit 7110, the enablement circuit of realignment unit 7130 and the programmable counter 7140 adjusts the weight between the realignment loop 1001 and the tracking loop 1002 to reduce the conflict. According to some embodiments, the difference between FIG. 7 and FIG. 1 is the absence of the FBK divider 104 in FIG. 7 and the corresponding feedback loop from the ring oscillator 103 back to PFD 101. According to some embodiments, due to the absence of the feedback loop, there is no metastable issues because the programmable synchronous counter 7140 is driven by a reference clock in the same clock domain. According to some embodiments, if the weight value is set to 1023, the tracking loop 1002 is enabled only in 1 period of a reference clock cycle and the tracking loop 1002 is disabled in other 1023 periods of the reference clock cycles. Then the realignment loop 1001 runs, as a result, the weight of tracking loop 1002 and realignment loop 1001 is 1/1023.

Figure 8:
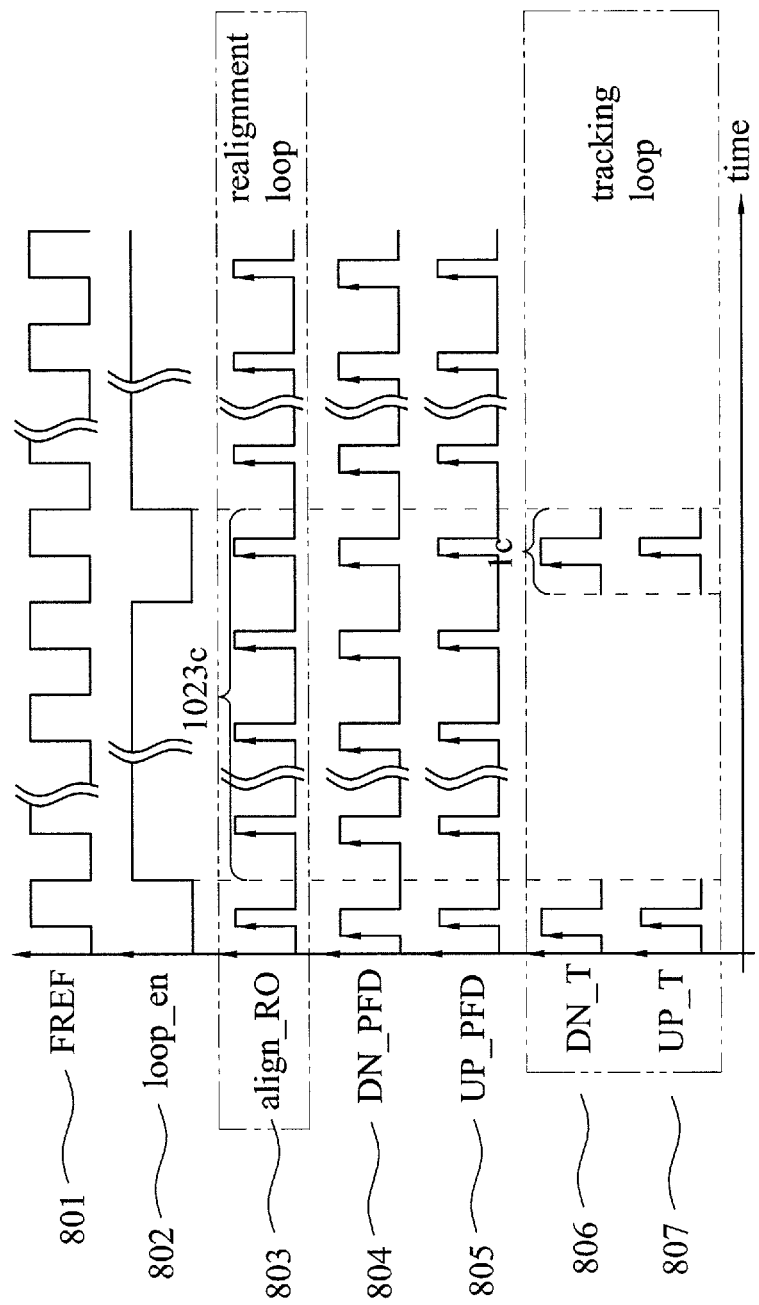
FIG. 8 is a schematic illustration of the timing diagram of the circuit in FIG. 7, in accordance with some embodiments.

FIG. 8 is a schematic illustration of the timing diagram of the circuit in FIG. 7, in accordance with some embodiments. According to some embodiments, when the timing diagram of FREF is 801, the loop_en is 802, the align_RO of the realignment loop 1001 is 803, the DN_PFD timing diagram is 804, the DN_PFD timing diagram is 805, and the corresponding tracking loop 1002 timing diagrams DN_T and UP_T are 806 and 807, respectively. As illustrated in FIG. 8, the realignment loop 1001 is enabled for 1023 cycles for align_RO 803, while for the tracking loop 1002, only one cycle in 806 and 807. According to some embodiments, if the weight value is set to 1023, the tracking loop 1002 is enabled only in 1 period of reference clock cycle and the tracking loop 1002 is disabled in other 1023 periods of reference clock cycles. Then the realignment loop 1001 runs, as a result, the weight of tracking loop 1002 and realignment loop 1001 is 1/1023. As illustrated in the timing diagrams, for example, the 803 timing diagram align_RO is the realignment loop 1001 timing diagram, in which 1023 periods are observed; while as a comparison, in the 806 DN_T timing diagram of the traditional tracking loop 1002, only 1 period is enabled and all others are disabled. Accordingly, the ratio of 1023 periods to 1 period is the realignment strength 1023:1.

Figure 9:
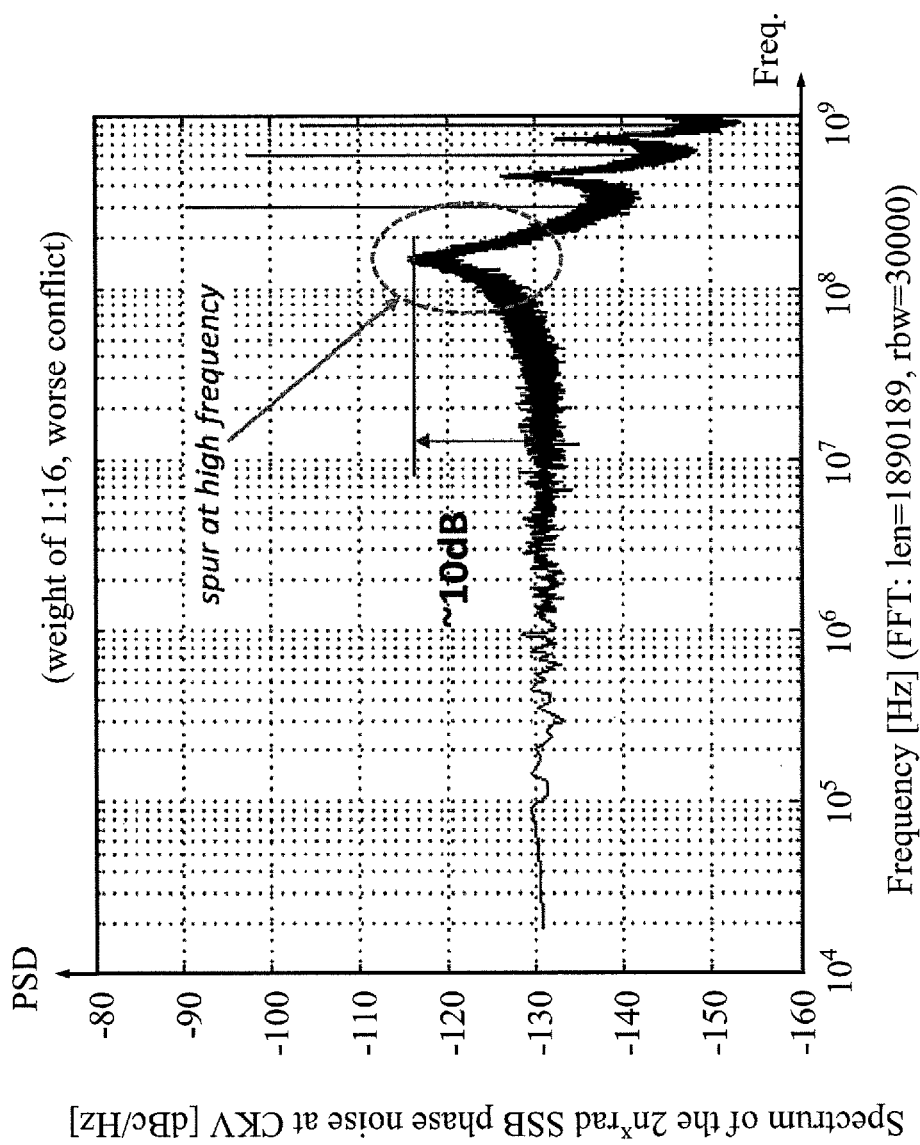
FIG. 9 is a schematic illustration of the power spectral density when the realignment weight is 1:16, in accordance with some embodiments.
Figure 10:
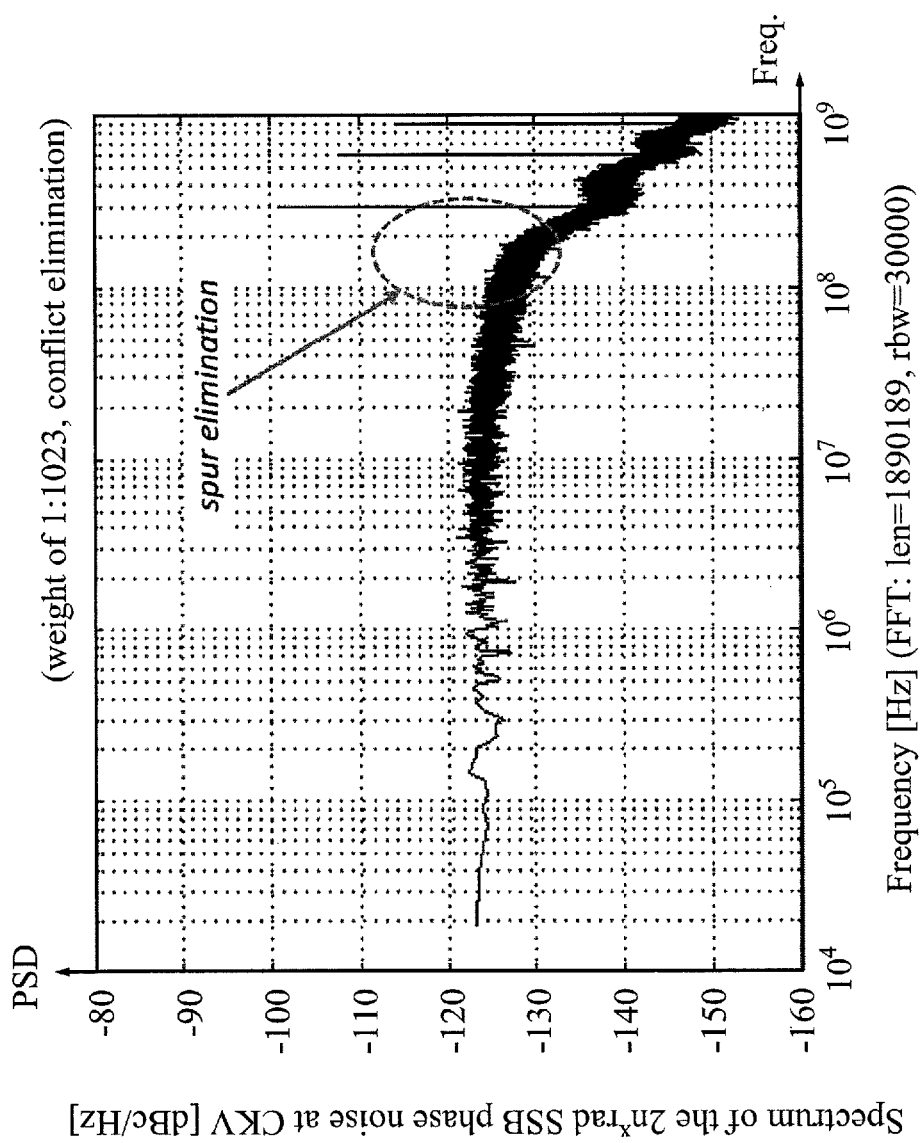
FIG. 10 is a schematic illustration of the power spectral density when the realignment weight is 1:1023, in accordance with some embodiments.

FIG. 9 is a schematic illustration of the power spectral density when the realignment weight is 1:16, in accordance with some embodiments. FIG. 10 is a schematic illustration of the power spectral density when the realignment weight is 1:1023, in accordance with some embodiments. Both FIG. 9 and FIG. 10 are plotted in log-log scale, where the x-axis is log of frequency and the y-axis is the log of power spectral destiny. The loop conflict impacts the performance of PLL phase noise. According to some embodiments, in FIG. 9, the realignment strength of tracking loop 1002 and realignment loop 1001 is 1:16. The conflict causes a spur at high frequency end. The peak noise of the spur is worse around 10 dB compared to the in-band noise floor that degrades the integrated jitter. As a comparison in FIG. 10, the realignment strength of tracking loop 1002 and realignment loop 1001 is 1:1023. The loop conflict and the spur are eliminated to yield a smooth PLL phase noise. The integrated jitter is less than 1 ps.

FIG. 11 is a flow chart illustrating a method 1100 for adjusting a realignment strength of a phase lock circuit (PLL), in accordance with some embodiments. At operation 1102, a first plurality of digits is accumulated within the PLL. The first plurality of digits is compared at operation 1104 with a second plurality of external target digits. In response to a first result of the comparing, a tracking loop of the PLL is disabled at operation 1106. A pulse with adjustable width is generated at operation 1108. A phase of an oscillator of the PLL is aligned at operation 1110 with a reference signal based on the pulse.

In one embodiment, the realignment strength of the PLL is determined by the adjustable width. In another embodiment, the method may also include enabling the tracking loop of the PLL in response to a second result of the comparing.

According to some embodiments, a circuit having a tracking loop and a realignment loop is disclosed. The circuit includes: a phase frequency detector (PFD) module for comparing a phase difference of a first input signal and a second input signal; a pump module for converting PFD phase error to charge, wherein the pump module further comprises a low pass filter (LPF); an adjustable realignment module for adjusting a realignment strength, the adjustable realignment module receives a first plurality of inputs from the PFD module, the adjustable realignment module transmits a second plurality of outputs to the pump module; and a ring oscillator unit, the ring oscillator unit receives a first input from the pump module and a second input from the adjustable realignment module, and based on the first and second inputs produces a feedback signal. According to some embodiments, the adjustable realignment module further comprises an enablement circuit unit for disabling a tracking loop. According to some embodiments, the adjustable realignment module further comprises a realignment pulse generator unit for generating pulses with adjustable width provided to the ring oscillator unit. According to some embodiments, the adjustable realignment module further comprises a programmable counter unit coupled to the enablement circuit unit for adjusting a period of enablement. According to some embodiments, the enablement circuit unit further comprises two multiplexers, a first multiplexer receives a down signal from the PFD module, wherein a second multiplexer receives an up signal from the PFD, and wherein the second multiplexer is controlled by a selector signal. According to some embodiments, the realignment pulse generator unit further comprises five NAND gates, one multiplexer and one AND gate, wherein the output of a first NAND gate is electrically connected to a first input of a second NAND gate, a first input of a third NAND gate, and a second input of a fifth NAND gate, wherein an input of the first NAND gate is electrically connected to the output of the second NAND gate, wherein a second input of the second NAND gate is electrically connected to a second input of a fourth NAND gate, wherein a third input of the second NAND gate is electrically connected to an output of the third NAND gate, a first input of the fourth NAND gate, and a first input of the fifth NAND gate, wherein the second input of the third NAND gate is electrically connected to an output of the fourth NAND gate, and wherein an output of the fifth NAND gate is electrically connected to an input of the AND gate. According to some embodiments, the programmable counter unit further comprises a synchronous counter driven by a reference clock for accumulating digits. According to some embodiments, the programmable counter unit further comprises a target detector coupled to the synchronous counter for comparing the digits from the synchronous counter and external target digits. According to some embodiments, the synchronous counter further comprises a latch and a multiplexer, an output of the multiplexer is transmitted to the latch. According to some embodiments, the target detector further comprises two NOR gates and a latch, an output of the latch is transmitted to a second NOR gate as a first input, wherein the output of a first NOR gate is transmitted to the second NOR gate as a second input. According to some embodiments, the circuit further includes a divider unit for receiving an input from the ring oscillator unit and transmitting an output to the PFD module.

According to some embodiments, a phase lock loop (PLL) circuit with phase frequency detector (PFD) is disclosed. The PLL circuit includes an enablement circuit unit for breaking a tracking loop, a pulse generator unit for generating a pulse with an adjustable width and a programmable counter, the programmable counter further includes a synchronous counter module for accumulating a first plurality of digits, wherein the synchronous counter module is driven by a reference clock and a target detector module for comparing the first plurality of digits accumulated by the synchronous counter module and a second plurality of external target digits, wherein the target detector module compares a plurality of digits from the synchronous counter module and the plurality of external digits. According to some embodiments, the synchronous counter module further comprises a latch and a multiplexer, an output of the multiplexer is transmitted to the latch. According to some embodiments, the target detector module further includes a latch. According to some embodiments, the target detector module further comprises a first NOR gate. According to some embodiments, the target detector module further comprises a second NOR gate, an output of the latch is transmitted to a second NOR gate as a first input, the output of a first NOR gate is transmitted to the second NOR gate as a second input. According to some embodiments, the synchronous counter module is driven by a reference clock. According to some embodiments, the plurality of external digits is ten digits.

According to some embodiments, an adjustable realignment module for adjusting the realignment strength is disclosed. The adjustable realignment module includes: an enablement circuit unit for breaking a tracking loop; a realignment pulse generator unit for generating pulses with adjustable width; and a programmable counter unit, the adjustable realignment module receives a first plurality of inputs from a phase frequency detector (PFD) module, the adjustable realignment module transmits a second plurality of outputs to a pump module, the pump module further comprises a low pass filter. According to some embodiments, the programmable counter unit further comprises a synchronous counter unit and a target detector unit.

According to some embodiments, a method for adjusting a realignment strength of a phase lock circuit (PLL) is disclosed. The method includes: accumulating a first plurality of digits; comparing the first plurality of digits with a second plurality of external target digits; disabling a tracking loop of the PLL in response to a first result of the comparing; generating a pulse with adjustable width; and aligning a phase of an oscillator of the PLL with a reference signal based on the pulse. According to some embodiments, the realignment strength of the PLL is determined by the adjustable width. According to some embodiments, the method further includes enabling the tracking loop of the PLL in response to a second result of the comparing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit having a tracking loop and a realignment loop, comprising:
    a phase frequency detector (PFD) module for comparing a phase difference of a first input signal and a second input signal;
    a pump module for converting PFD phase error to charge, wherein the pump module further comprises a low pass filter (LPF);
    an adjustable realignment module for adjusting a realignment strength, wherein the adjustable realignment module receives a first plurality of inputs from the PFD module, wherein the adjustable realignment module transmits a second plurality of outputs to the pump module; and
    a ring oscillator unit, wherein the ring oscillator unit receives a first input from the pump module and a second input from the adjustable realignment module, and based on the first and second inputs produces a feedback signal.

2. The circuit of claim 1, wherein the adjustable realignment module comprises an enablement circuit unit for disabling a tracking loop.

3. The circuit of claim 2, wherein the adjustable realignment module further comprises a realignment pulse generator unit for generating pulses with adjustable width provided to the ring oscillator unit.

4. The circuit of claim 3, wherein the adjustable realignment module further comprises a programmable counter unit coupled to the enablement circuit unit for adjusting a period of enablement.

5. The circuit of claim 2, wherein the enablement circuit unit further comprises two multiplexers, wherein a first multiplexer receives a down signal from the PFD module, wherein a second multiplexer receives an up signal from the PFD, and wherein the second multiplexer is controlled by a selector signal.

6. The circuit of claim 3, wherein the realignment pulse generator unit further comprises five NAND gates, one multiplexer and one AND gate, wherein the output of a first NAND gate is electrically connected to a first input of a second NAND gate, a first input of a third NAND gate, and a second input of a fifth NAND gate, wherein an input of the first NAND gate is electrically connected to the output of the second NAND gate, wherein a second input of the second NAND gate is electrically connected to a second input of a fourth NAND gate, wherein a third input of the second NAND gate is electrically connected to an output of the third NAND gate, a first input of the fourth NAND gate, and a first input of the fifth NAND gate, wherein the second input of the third NAND gate is electrically connected to an output of the fourth NAND gate, and wherein an output of the fifth NAND gate is electrically connected to an input of the AND gate.

7. The circuit of claim 4, wherein the programmable counter unit further comprises a synchronous counter driven by a reference clock for accumulating digits.

8. The circuit of claim 7, wherein the programmable counter unit further comprises a target detector coupled to the synchronous counter for comparing the digits from the synchronous counter and external target digits.

9. The circuit of claim 7, wherein the synchronous counter further comprises a latch and a multiplexer, wherein an output of the multiplexer is transmitted to the latch.

10. The circuit of claim 8 wherein the target detector further comprises two NOR gates and a latch, wherein an output of the latch is transmitted to a second NOR gate as a first input, wherein the output of a first NOR gate is transmitted to the second NOR gate as a second input.

11. The circuit of claim 1, further comprises:
a divider unit for receiving an input from the ring oscillator unit and transmitting an output to the PFD module.

12. A phase lock loop (PLL) circuit with phase frequency detector (PFD), comprising;
an enablement circuit unit for breaking a tracking loop;
a pulse generator unit for generating a pulse with an adjustable width; and
a programmable counter, wherein the programmable counter further comprises:
a synchronous counter module for accumulating a first plurality of digits, wherein the synchronous counter module is driven by a reference clock; and
a target detector module for comparing the first plurality of digits accumulated by the synchronous counter module and a second plurality of external target digits, wherein the target detector module compares a plurality of digits from the synchronous counter module and the plurality of external digits.

13. The programmable counter of claim 12, wherein the synchronous counter module further comprises a latch and a multiplexer, wherein an output of the multiplexer is transmitted to the latch.

14. The programmable counter of claim 12, wherein the target detector module further comprises a latch.

15. The programmable counter of claim 14, wherein the target detector module further comprises a first NOR gate.

16. The programmable counter of claim 15, wherein the target detector module further comprises a second NOR gate, wherein an output of the latch is transmitted to a second NOR gate as a first input, wherein the output of a first NOR gate is transmitted to the second NOR gate as a second input.

17. The programmable counter of claim 13, wherein the synchronous counter module is driven by a reference clock.

18. The programmable counter of claim 12, wherein the plurality of external digits is ten digits.

19. A method for adjusting a realignment strength of a phase lock circuit (PLL), comprising:
accumulating a first plurality of digits;
comparing the first plurality of digits with a second plurality of external target digits;
disabling a tracking loop of the PLL in response to a first result of the comparing;
generating a pulse with adjustable width; and
aligning a phase of an oscillator of the PLL with a reference signal based on the pulse, wherein the realignment strength of the PLL is determined by the adjustable width.

20. The method of claim 19, further comprising:
enabling the tracking loop of the PLL in response to a second result of the comparing.

* * * * *